United States Patent
Kakinuma et al.

(10) Patent No.: US 7,462,653 B2
(45) Date of Patent: Dec. 9, 2008

(54) PHOTOCURABLE AND THERMOSETTING COMPOSITION FOR INK JET SYSTEM AND PRINTED CIRCUIT BOARDS MADE BY USE THEREOF

(75) Inventors: Masahisa Kakinuma, Osato-gun (JP); Masatoshi Kusama, Sakado (JP); Shigeru Ushiki, Hiki-gun (JP)

(73) Assignee: Taiyo Ink Manufacturing Co., Ltd., Tokyo (JP)

( * ) Notice: Subject to any disclaimer, the term of this patent is extended or adjusted under 35 U.S.C. 154(b) by 121 days.

(21) Appl. No.: 11/269,836

(22) Filed: Nov. 9, 2005

(65) Prior Publication Data

US 2006/0058412 A1    Mar. 16, 2006

Related U.S. Application Data

(63) Continuation of application No. PCT/JP04/06029, filed on May 7, 2004.

(30) Foreign Application Priority Data

May 9, 2003     (JP) .............................. 2003-131742

(51) Int. Cl.
*C08F 2/46*     (2006.01)
*C08F 2/50*     (2006.01)
*C08J 3/28*     (2006.01)
*G03F 7/00*     (2006.01)
*G03F 7/16*     (2006.01)

(52) U.S. Cl. ........................ 522/100; 522/103; 522/168; 522/170; 522/173; 522/174; 522/175; 522/176; 522/178; 522/179; 522/184; 522/182; 430/269; 430/270.1; 430/281.1; 430/280.1

(58) Field of Classification Search .................. 522/182, 522/181, 168, 170, 173, 174, 175, 176, 178, 522/179, 184, 100, 103; 430/269, 270.1, 430/280.1, 281.1
See application file for complete search history.

(56) References Cited

U.S. PATENT DOCUMENTS

| | | |
|---|---|---|
| 4,113,592 A | 9/1978 | Rybny et al. |
| 4,141,806 A | 2/1979 | Keggenhoff et al. |
| 4,257,859 A | 3/1981 | Fischer et al. |
| 4,612,336 A | 9/1986 | Yada et al. |

FOREIGN PATENT DOCUMENTS

| | | | |
|---|---|---|---|
| JP | 56-66089 | | 6/1981 |
| JP | 56-157089 | | 12/1981 |
| JP | 58-50794 | | 3/1983 |
| JP | 6-126941 | | 5/1994 |
| JP | 6-143551 | | 5/1994 |
| JP | 6-237063 | | 8/1994 |
| JP | 7-263845 | | 10/1995 |
| JP | 8-236902 | | 9/1996 |
| JP | 9-18115 | | 1/1997 |
| JP | 9-185166 | | 7/1997 |
| JP | 11-21327 | | 1/1999 |
| JP | 11184085 A | * | 7/1999 |
| JP | 11184086 A | * | 7/1999 |
| JP | 2000-330276 | | 11/2000 |
| JP | 2002-182383 | | 6/2002 |
| JP | 2002-241664 | | 8/2002 |
| JP | 2003-5365 | | 1/2003 |

OTHER PUBLICATIONS

Epikote 828 Arcrylate description. [online], [retrived May 10, 2008] Retrieved from the internet: <URL:http://www.chemindustry.com/chemicals/1816649.html>.*

Epikote 828 Acrylate synonym description. [online], [retieved on May 10, 2008], Retrieved from the internet:<URL:http://pubchem.ncbi.nlm.nih.gov/summary/summary.cgi?cid=169944#Synonyms>.*

Epikote 828 Acrylate synonym description. [online], [retieved on May 10, 2008], Retrieved from the internet:<URL:http://www.ncbi.nlm.nih.gov/sites/entrez?term=%22Epikote%20828%20acrylate%22%5BSynonym%5D%20169944%5Bcid%5D&cmd=search&db=pcsubstance>.*

* cited by examiner

*Primary Examiner*—Sanza L McClendon
(74) *Attorney, Agent, or Firm*—Oblon, Spivak, McClelland, Maier & Neustadt, P.C.

(57) ABSTRACT

A photocurable and thermosetting composition for an ink jet system comprises (A) a monomer having a (meth)acryloyl group and a thermosetting functional group in its molecule, (B) a photoreactive diluent having a weight-average molecular weight of not more than 700 other than the component (A) mentioned above, and (C) a photopolymerization initiator and has a viscosity of not more than 150 mPa·s at 25° C. A solder resist pattern is directly drawn on a printed circuit board by means of an ink jet printer using the above-mentioned composition, and the pattern is primarily cured by irradiation with an active energy ray and then further cured by heating.

6 Claims, No Drawings

PHOTOCURABLE AND THERMOSETTING COMPOSITION FOR INK JET SYSTEM AND PRINTED CIRCUIT BOARDS MADE BY USE THEREOF

CROSS-REFERENCE TO RELATED APPLICATIONS

This is a continuation of Application PCT/JP2004/006029, filed May 7, 2004, which was published under PCT Article 21(2).

BACKGROUND OF THE INVENTION

1. Field of the Invention

This invention relates to a photocurable and thermosetting composition which is possessed of heat resistance and suitable as a solder resist ink for the direct drawing by means of an ink jet printer and to a printed circuit board having a solder resist pattern directly drawn thereon by the use of the composition.

2. Description of the Prior Art

As a method for the manufacture of printed circuit boards using an ink jet printer, a method which comprises forming an etching resist by drawing a conductor circuit pattern on a metal foil laminated on a plastic substrate by means of an ink jet printer and performing an etching treatment has already been proposed (see Published Japanese Patent Applications JP 56-66089 A, JP 56-157089 A, JP 58-50794 A, and JP 6-237063 A). Since this method performs the direct drawing according to CAD data, it has such advantages that the time and labor required for the process may be considerably reduced and, at the same time, such expendables as a developing solution, a resist ink, and a washing solvent may also be curtailed as compared with the patterning by a photolithographic developing process which requires a photo-mask and uses a photosensitive resin and a method for performing the patterning with a resist ink by a screen printing process.

Also as to a solder resist which protects a conductor circuit formed on a printed circuit board, the formation thereof by means of an ink jet method has already been proposed (see JP 7-263845 A and JP 9-18115 A) and the method is the same as that for an etching resist. In this case too, the number of steps, time, and expendables may be reducible as compared with the photolithographic developing method or the screen printing method. Furthermore, the division of an ink tank to those for an etching resist, a solder resist, a marking ink, and the curing agents thereof and the sharing of a printer therefor for the purpose of further making use of the advantages of the ink jet system has also been proposed (see JP 8-236902 A).

However, the ink for the ink jet system is subjected to such restriction that its viscosity should be not more than about 20 mPa·s at the time of application thereof. This viscosity is far different from the viscosity of the ink to be used in screen printing, around 20,000 mPa·s, and even if this ink is diluted with a large amount of diluent, it will be difficult to lower its viscosity to a desired level. Moreover, even if the decrease in viscosity is attained, conversely the physical properties required of a solder resist, such as heat resistance and resistance to chemicals, will deteriorate considerably. Furthermore, when it is diluted with a volatile solvent, a nonvolatile content becomes very low and, as a result, it will be difficult to attain a sufficient film thickness. Therefore, the above-mentioned ink jet system remains at an idea level as far as a solder resist of a printed circuit board is concerned, and the practical solder resist ink which can be used with an ink jet printer did not exist.

SUMMARY OF THE INVENTION

The present invention has been made to solve the problems of the prior art described above and has a primary object to provide a photocurable and thermosetting composition which is possessed of heat resistance and enabled as a solder resist ink to effect the direct drawing on a printed circuit board by the use of an ink jet printer.

A further object of the present invention is to provide a printed circuit board having a heat-resistant solder resist pattern formed thereon by the direct drawing using such a photocurable and thermosetting composition.

To accomplish the objects mentioned above, the present invention provides a photocurable and thermosetting composition possessed of heat resistance for an ink jet system characterized in that it comprises (A) a monomer having a (meth) acryloyl group and a thermosetting functional group in its molecule, (B) a photoreactive diluent having a weight-average molecular weight of not more than 700 other than the component (A) mentioned above, and (C) a photopolymerization initiator and that it has a viscosity of not more than 150 mPa·s at 25° C.

The term "viscosity" as used herein means the viscosity measured at ordinary temperature (25° C.) according to JIS (Japanese Industrial Standard) K2283. As described above, in the case of the ink jet system the viscosity of ink is required to be not more than about 20 mPa·s at the temperature when the application thereof is carried out. If the viscosity is not more than 150 mPa·s at ordinary temperature, however, this condition will be satisfied by warming the ink at the time of application. Incidentally, the term "(meth)acryloyl group" as used in the present specification refers collectively to an acryloyl group and a methacryloyl group. This holds good for other similar expression.

In a more concrete preferred embodiment, the thermosetting functional group of the above-mentioned monomer (A) is at least one functional group selected from the group consisting of a hydroxyl group, a carboxyl group, an isocyanate group, an amino group, an imino group, an epoxy group, an oxetanyl group, a mercapto group, a methoxymethyl group, a methoxyethyl group, an ethoxymethyl group, an ethoxyethyl group, and an oxazoline group, and the above-mentioned photopolymerization initiator (C) is at least one member selected from the group consisting of photo-radical polymerization initiators and photo-cationic polymerization initiators.

Although the compounding ratios of the components of the photocurable and thermosetting composition mentioned above may be set arbitrarily insofar as it falls within such a ratio that the viscosity of the composition becomes 150 mPa·s or less, generally the proper ratio of the aforementioned photoreactive diluent (B) having a weight-average molecular weight of not more than 700 is in the range of 20 to 1,000 parts by weight, based on 100 parts by weight of the aforementioned monomer (A) having a (meth)acryloyl group and a thermosetting functional group in its molecule. On the other hand, the proper ratio of combination of the photopolymerization initiator (C) is in the range of 0.5 to 10% by weight of the total amount of the composition.

In accordance with the present invention, there is further provided a printed circuit board having a solder resist pattern directly drawn thereon by means of an ink jet printer using the above-mentioned photocurable and thermosetting composition possessed of heat resistance for the ink jet system.

Although the photocurable and thermosetting composition of the present invention for the ink jet system has so low viscosity that it can be injected by the ink jet system, it allows the formation of a pattern of a cured film having physical properties required of a solder resist, such as heat resistance and resistance to chemicals.

Therefore, a fine pattern excelling in various properties, such as heat resistance, resistance to soldering heat, resistance to chemicals, hardness, electrical insulating properties, and resistance to electroless plating, may be formed by directly drawing a solder resist pattern by means of an ink jet printer using the photocurable and thermosetting composition of the present invention for the ink jet system, irradiating the resist pattern with an active energy ray to primarily cure the resist pattern, and then further curing the resist pattern by heating it.

DETAILED DESCRIPTION OF THE INVENTION

The present inventors, after pursuing a diligent study on a photocurable and thermosetting composition which is possessed of heat resistance and enabled as the solder resist ink to effect the direct drawing on a printed circuit board by means of an ink jet printer, have found that a photocurable and thermosetting composition obtained by compounding a monomer (A) having a (meth)acryloyl group and a thermosetting functional group in its molecule as a base monomer with a photoreactive diluent (B) having a weight-average molecular weight of not more than 700 and a photopolymerization initiator (C) possesses such practical properties as heat resistance and resistance to chemicals as a solder resist which can be applied with an ink jet printer. As a result, the present invention has been perfected. Here, the reason for restricting the weight-average molecular weight of the photoreactive diluent (B) to 700 or less is that if the weight-average molecular weight is larger than 700, it is not possible to lower the viscosity of the composition to the level of 150 mPa·s or less at 25° C. which allows the composition to be applied with an ink jet printer.

That is, although the photocurable and thermosetting composition of the present invention for the ink jet system has so low viscosity that it can be injected by the ink jet system, it allows the formation of a pattern of a cured film having physical properties required of a solder resist, such as heat resistance and resistance to chemicals. Particularly, since the composition of the present invention contains the monomer (A) having a (meth)acryloyl group and a thermosetting functional group in its molecule as an indispensable component, it is possible to prevent the sagging of a pattern, for example, by directly drawing a solder resist pattern on a printed circuit board by means of an ink jet printer using the photocurable and thermosetting composition of the present invention for the ink jet system and primarily curing it by irradiation of an active energy ray. Further, when it is further cured by heating, it is possible to effectively form the three-dimensionally crosslinked structure because the monomer component (A) of the present invention having a (meth)acryloyl group and a thermosetting functional group has both the photoreactive functional group and the thermosetting functional group in its molecule. As a result, it is possible to form a fine pattern excelling in various properties, such as heat resistance, resistance to soldering heat, resistance to chemicals, hardness, electrical insulating properties, and resistance to electroless plating. Here, the irradiation condition of an active energy ray is preferred to be not less than 100 mJ/cm$^2$, preferably in the range of 300 mJ/cm$^2$ to 2,000 mJ/cm$^2$. Further, the conditions of thermal curing are desired to be not less than 10 minutes at 80-200° C., preferably in the range of 20-60 minutes at 140-180° C.

Although the irradiation of an active energy ray mentioned above may be performed after the drawing of a pattern by means of an ink jet printer, it is preferable that the irradiation of the active energy ray be carried out simultaneously with the drawing of a pattern by means of an ink jet printer, for example, by irradiating the pattern with the active energy ray laterally or from the bottom side thereof, or the like. As light sources for the irradiation of the active energy ray, it is appropriate to use a low-pressure mercury-vapor lamp, a medium-pressure mercury-vapor lamp, a high-pressure mercury-vapor lamp, an ultra-high-pressure mercury-vapor lamp, a xenon lamp, and a metal halide lamp, for example. Besides, electron beams, α-rays, β-rays, γ-rays, X-rays, neutron beams, etc. may be utilized.

Now, the photocurable and thermosetting composition of the present invention for the ink jet system will be described in detail below.

First, as a thermosetting functional group of the monomer (A) having a (meth)acryloyl group and a thermosetting functional group in its molecule, a hydroxyl group, a carboxyl group, an isocyanate group, an amino group, an imino group, an epoxy group, an oxetanyl group, a mercapto group, a methoxymethyl group, a methoxyethyl group, an ethoxymethyl group, an ethoxyethyl group, an oxazoline group, or the like may be cited.

As concrete examples of the monomer (A) of which thermosetting functional group is a hydroxyl group, 2-hydroxyethyl (meth)acrylate, 2-hydroxypropyl (meth)acrylate, 4-hydroxybutyl (meth)acrylate, pentaerythritol tri(meth)acrylate, dipentaerythritol monohydroxypenta(meth)acrylate, etc. may be cited. As the commercially available compounds, LIGHT-ESTER HO, LIGHT-ESTER HOP, LIGHT-ACRYLATE HOA (all trade names of the products manufactured by Kyoeisha Chemical Co., Ltd.), etc. may be cited.

As concrete examples of the monomer (A) of which thermosetting functional group is a carboxyl group, acrylic acid, methacrylic acid, acrylic acid dimer, 2-methacryloyloxyethyl succinic acid, 2-methacryloyloxyethyl hexahydrophthalic acid, phthalic acid monohydroxyethyl acrylate, etc. may be cited. As the commercially available compounds, LIGHT-ESTER HO-MS, LIGHT-ESTER HO-HH (all trade names of the products manufactured by Kyoeisha Chemical Co., Ltd.), ARONIX M-5400 (trade name of the product manufactured by Toagosei Co., Ltd.), etc. may be cited.

As concrete examples of the monomer (A) of which thermosetting functional group is an isocyanate group, 2-methacryloyloxyethyl isocyanate (for example, trade name Karenz MOI manufactured by Showa Denko K.K.) etc. may be cited.

As concrete examples of the monomer (A) of which thermosetting functional group is an amino group, acrylamide, N,N-dimethylaminoethyl acrylate, N,N-dimethylaminoethyl methacrylate, N,N-diethylaminoethyl acrylate, N,N-diethylaminoethyl methacrylate, etc. may be cited.

As concrete examples of the monomer (A) of which thermosetting functional group is an epoxy group, glycidyl methacrylate, (meth)acryloyl group-containing alicyclic epoxy resins, etc. may be cited. As the commercially available compounds, CYCLOMER M100, CYCLOMER A200, CYCLOMER 2000 (all trade names of the products manufactured by Daicel Chemical Industries, Ltd.), etc. may be cited.

As concrete examples of the monomer (A) of which thermosetting functional group is an oxetanyl group, oxetane (meth)acrylate etc. may be cited. As the commercially available compounds, OXE-10, OXE-30 (all trade names of the products manufactured by Osaka Organic Chemical Ind., Ltd.), etc. may be cited.

As concrete examples of the monomer (A) of which thermosetting functional group is a mercapto group, ethylthio acrylate, ethylthio methacrylate, biphenylthio acrylate, biphenylthio methacrylate, nitrophenylthio acrylate, nitrophenylthio methacrylate, triphenylmethylthio acrylate, triphenylmethylthio methacrylate, trisacrylate of 1,2-bis[(2-mercaptoethyl)thio]-3-mercaptopropane, 2-(mercaptomethyl)-methyl ester of acrylic acid, 2-[(2-mercaptoethyl)thio]-ethyl ester of methacrylic acid, etc. may be cited.

As concrete examples of the monomer (A) of which thermosetting functional group is a methoxymethyl group, methoxymethyl acrylate, methoxymethyl methacrylate, dimethoxymethyl acrylate, dimethoxymethyl methacrylate, etc. may be cited. As the commercially available compounds, NIKALAC MX-302 (acryl-modified alkylated melamine, trade name of the product manufactured by Sanwa Chemical Co., Ltd.) etc. may be cited.

As concrete examples of the monomer (A) of which thermosetting functional group is a methoxyethyl group, 1-methoxyethyl acrylate, 1-methoxyethyl methacrylate, 2-methoxyethyl acrylate, 2-methoxyethyl methacrylate, 1,1-methoxyethyl acrylate, 1,1-methoxyethyl methacrylate, etc. may be cited.

As concrete examples of the monomer (A) of which thermosetting functional group is an ethoxyethyl group, 1-ethoxyethyl acrylate, 1-ethoxyethyl methacrylate, 2-ethoxyethyl acrylate, 2-ethoxyethyl methacrylate, etc. may be cited.

As concrete examples of the monomer (A) of which thermosetting functional group is an ethoxymethyl group, N-ethoxymethyl acrylamide, N-ethoxymethyl methacrylamide, ethoxymethyl acrylate, ethoxymethyl methacrylate, etc. may be cited.

As concrete examples of the monomer (A) of which thermosetting functional group is an oxazoline group, 2-methyl-2-{[3-(4,5-dihydro-2-oxazolyl)benzoyl]amino}ethyl ester of acrylic acid, 2-methyl-2-(4,5-dihydro-2-oxazolyl)ethyl ester of acrylic acid, 3-(4,5-dihydro-4,4-dimethyl-2-oxazolyl)propyl ester of acrylic acid, etc. may be cited.

The photoreactive diluent (B) having a weight-average molecular weight of not more than 700 is in the liquid state at room temperature. As the typical photoreactive group thereof, a (meth)acryloyl group may be cited.

As concrete examples of a monomer having one (meth)acryloyl group in its molecule, for example, (meth)acrylates such as methyl (meth)acrylate, ethyl (meth)acrylate, butyl (meth)acrylate, isobutyl (meth)acrylate, lauryl (meth)actylate, stearyl (meth)acrylate, 2-hydroxyethyl (meth)acrylate, hydroxypropyl (meth)acrylate, hydroxybutyl (meth)acrylate, and glycidyl (meth)acrylate; acryloyl morpholine, etc. may be cited.

As concrete examples of a polyfunctional monomer having two or more (meth)acryloyl groups in its molecule, for example, polyethylene glycol diacrylates such as diethylene glycol diacrylate, triethylene glycol diacrylate, and tetraethylene glycol diacrylate; or polyurethane diacrylates, and methacrylates corresponding the acrylates enumerated above; polyfunctional acrylates represented by pentaerythritol triacrylate, trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, pentaerythritol tetramethacrylate, tetramethylolmethane tetraacrylate, ethylene oxide-modified phosphric triacrylate, epichlorohydrin-modified glycerol triacrylate, dipentaerythritol hexaacrylate, dipentaerythritol monohydroxy pentaacrylate, bisphenol fluorene dihydroxy acrylate, and bisphenol fluorene dimethacrylate, or silsesquioxane-modified products thereof, or methacrylate monomers corresponding to the acrylates enumerated above may be cited.

Further, the polyfunctional (meth)acrylates obtained by esterification or amidation of a carboxyl group-containing polymer, such as polymethacrylic acid, polyacrylic acid, and polymaleic acid, with butanediol monoacrylate, polyethylene glycol acrylate, or the like to introduce an acrylate group thereinto may be used.

As other photoreactive diluents (B), the compounds having an unsaturated double bond, an oxetanyl group, or an epoxy group, such as vinyl ethers, ethylene derivatives, styrene, chloromethylstyrene, α-methylstyrene, maleic anhydride, dicyclopentadiene, N-vinylpyrrolidone, N-vinylformamide, xylylene dioxetane, oxetane alcohol, 3-ethyl-3-(phenoxymethyl)oxetane, and resorcinol diglycidyl ether, may be cited.

As the photopolymerization initiator (C) to be used in the present invention, a photo-radical polymerization initiator and a photo-cationic polymerization initiator may be used.

All the compounds which generate radicals by irradiation of light, laser beams, electron beams, etc. and initiate the radical polymerization reaction may be used as the photo-radical polymerization initiator.

As the photo-radical polymerization initiator, for example, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one, 2-benzyl-2-dimethylamino-1-(4-morpholinophenyl)-butan-1-one, and N,N-dimethylaminoacetophenone; anthraquinones such as 2-methyl-anthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; dimer of 2,4,5-triaryl imidazole; riboflavin tetrabutylate; thiol compounds such as 2-mercaptobenzimidazole, 2-mercaptobenzoxazole, and 2-mercaptobenzothiazole; 2,4,6-tris-S-triazine; organic halogen compounds such as 2,2,2-tribromoethanol and tribromomethyl phenyl sulfone; benzophenones such as benzophenone and 4,4'-bis(diethylamino)benzophenone or xanthones; 2,4,6-trimethylbenzoyl diphenyl phosphine oxide, etc. may be cited. These known and commonly used photopolymerization initiators may be used either singly or in the form of a mixture of two or more members, or further in combination with a photo-initiator aid such as tertiary amines like N,N-(dimethylamino)ethylbenzoate, N,N-(dimethylamino)isoamylbenzoate, penthyl-4-dimethylaminobenzoate, triethyl amine, and triethanol amine. Further, a titanocene compound such as CGI-784 (product of Ciba Specialty Chemicals Inc.) and the like which exhibit absorption in a visible region may be added to promote the photochemical reaction. The photopolymerization initiator is not limited to the particular compounds enumerated above. Any compounds which absorb light in the ultraviolet region or visible region and cause radical polymerization of the unsaturated groups such as (meth)acryloyl groups may be used either singly or in the form of a combination of plural members irrespective of the photopolymerization initiator or the photo-initiator aid.

The photo-cationic polymerization initiator to be used in the present invention is a compound which initiates the cationic polymerization reaction by the action of light, laser beams, electron beams, etc. Any known and commonly used photo-cationic polymerization initiators may be used.

As the photo-cationic polymerization initiator which generates cationic species by the action of light, onium salts such as diazonium salts, iodonium salts, bromonium salts, chloronium salts, sulfonium salts, selenonium salts, pyrilium salts, thiapyrilium salts, and pyridinium salts; halogenated compounds such as tris(trihalomethyl)-s-triazine and derivatives thereof; 2-nitrobenzyl esters of sulfonic acid; iminosulfonates; 1-oxo-2-diazonaphthoquinone-4-sulfonate derivatives; N-hydroxy-imide=sulfonates; tri(methane sulfonyloxy)benzene derivatives; bissulfonyl diazomethanes; sulfonylcarbonyl alkanes; sulfonylcarbonyl diazo methanes; disulfone compounds, etc. may be cited.

As the commercially available compounds, CYRACURE UVI-6970, UVI-6974, UVI-6990, and UVI-6950 (all trade names of the products manufactured by Union Carbide Company), Irgacure 261 (trade name of the product manufactured by Ciba Specialty Chemicals Inc.), SP-150, SP-152, and SP-170 (all trade names of the products manufactured by Asahi Denka Co., Ltd.), CG-24-61 (trade name of the product manufactured by Ciba Specialty Chemicals Inc.), DAICAT II (trade name of the product manufactured by Daicel Chemical Industries, Ltd.), UVAC1591 (trade name of the product manufactured by Daicel UCB Co., Ltd.), CI-2734, CI-2855, CI-2823, and CI-2758 (all trade names of the products manufactured by Nippon Soda Co., Ltd.), PI-2074 (trade name of the product manufactured by RHONE-POULENC Co., Ltd.), FFC509 (trade name of the product manufactured by 3M Co., Ltd.), RHODSIL Photoinitiator 2074 (trade name of the product manufactured by Rhodia Co., Ltd.), BBI-102 and BBI-101 (all trade names of the products manufactured by Midori Kagaku K.K.), CD-1012 (trade name of the product manufactured by Sartomer Company Inc.), etc. may be cited.

Besides the components (A) to (C) mentioned above, the photocurable and thermosetting composition of the present invention may further incorporate therein as a thermosetting component a compound other than the component (A) and the component (B) mentioned above, for example, vinyl group-containing compounds such as diethylene glycol divinyl ether, allyl group-containing compounds such as triallyl isocyanate, hydroxyl group-containing compounds such as bisphenol A, hydrogenated bisphenol A, and phenol novolak resins, isocyanate group-containing compounds such as xylylene diisocyanate, amino group-containing compounds such as melamine, mercapto group-containing compounds such as methane dithiol, oxazoline group-containing compounds such as 1,3-phenylene bisoxazoline, carboxyl group-containing compounds such as malonic acid, succinic acid, and CIC acid (trade name of a series of products, carboxyl group-containing isocyanurates, manufactured by Shikoku Chemicals Corp.), oxetanyl group-containing compounds such as phenol novolak type oxetanes, acid anhydride group-containing compounds such as trimellitic anhydride, pyromellitic anhydride, and himic anhydride, epoxy group-containing compounds such as alicyclic epoxy resins and glycidyl ether type epoxy resins, methoxymethyl group-containing compounds, imino group-containing compounds, and ethoxymethyl group-containing compounds. In the photocurable and thermosetting composition for the ink jet system containing such a thermosetting component, this compound plays the role of a cross-linking agent and the cross-linking degree of the resultant cured coating film increases. As a result, it is possible to further improve various properties such as resistance to heat, hardness, resistance to soldering heat, resistance to chemicals, electrical insulating properties, and resistance to electroless plating.

The photocurable and thermosetting composition of the present invention for the ink jet system may incorporate therein, as occasion demands, a curing catalyst. As this curing catalyst, any known and commonly used curing agents or curing promoters such as, for example, imidazole derivatives, guanamines, polyamines, and organic acid salts and/or epoxy adducts of these compounds, triazine derivatives, tertiary amines, organic phosphines, phosphonium salts, quaternary ammonium salts, and polybasic acid anhydrides may be cited. These curing agents or curing promotors may be used either singly or in the form of a combination of two or more members.

Since the photocurable and thermosetting composition of the present invention for the ink jet system uses the photoreactive diluent (B) having a weight-average molecular weight of not more than 700 as mentioned above, basically there is no need to add a diluent solvent thereto. However, a diluent solvent may be added to the composition for the purpose of adjusting the viscosity of the composition. As the diluent solvent, for example, ketones such as methylethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, propylene glycol monoethyl ether, dipropylene glycol diethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethyl ether acetate, and dipropylene glycol monomethyl ether acetate; alcohols such as ethanol, propanol, ethylene glycol, and propylene glycol; aliphatic hydrocarbons such as octane and decane; petroleum solvents such as petroleum ether, petroleum naphtha, hydrogenated petroleum naphtha, and solvent naphtha, and the like may be cited.

The photocurable and thermosetting composition of the present invention may further incorporate therein, as occasion demands, any known and commonly used coloring agents such as phthalocyanine blue, phthalocyanine green, iodine green, disazo yellow, crystal violet, titanium oxide, carbon black, and naphthalene black, any known and commonly used polymerization inhibitors such as hydroquinone, hydroquinone monomethyl ether, tert-butyl catechol, pyrogallol, and phenothiazine, silicone type, fluorine type, or macromolecular type anti-foaming agents and/or leveling agents, adhesiveness-imparting agents such as the imidazole type, thiazole type, thiazole type, or silane coupling agents, or any other known and commonly used additives.

Now, the present invention will be described specifically below by reference to working examples. As a matter of course, the present invention is not limited to the following examples. Wherever the term "parts" is mentioned hereinafter, it is invariably based on weight unless otherwise specified.

EXAMPLES 1-7 AND COMPARATIVE EXAMPLE 1

Each of the photocurable and thermosetting compositions for the ink jet system was prepared by compounding relevant components shown in Table 1 at proportions shown in Table 2, mixing them with the Dispermat CA-40C and Milling System (manufactured by Gettmann Inc.) for 20 minutes to obtain a disperse system, and then filtering them through a filter of 1.0 µm.

TABLE 1

| | | |
|---|---|---|
| Component A | ① | Pentaerythritol triacrylate |
| | ② | 4-Hydroxybutyl acrylate |
| | ③ | Acrylic acid dimer |
| | ④ | 2-Methacryloxyethyl isocyanate |
| | ⑤ | CYCLOMER A-200 (acryloyl group-containing alicyclic epoxy resin manufactured by Daicel Chemical Industries, Ltd.) |
| | ⑥ | Oxetane methacrylate |
| | ⑦ | NIKALAC MX-302 (acryl-modified alkylated melamine manufactured by Sanwa Chemical Co., Ltd.) |
| | ⑧ | 2-Methoxyethyl acrylate |
| Component B (Numerals in parentheses indicate a molecular weight) | ① | Dipentaerythritol hexaacrylate (547) |
| | ② | Trimethylolpropane triacrylate (338) |
| | ③ | 1,9-Nonanediol diacrylate (268) |
| | ④ | Isobornyl acrylate (205) |
| | ⑤ | N-vinyl-2-pyrrolidone (111) |
| | ⑥ | N-vinyl formamide (71) |
| | ⑦ | Xylylene dioxetane (332) |
| | ⑧ | Resorcinol diglycidyl ether (234) |
| | ⑨ | Oxetane alcohol (116) |
| | ⑩ | 3-Ethyl-3-(phenoxymethyl)oxetane (192) |
| Photo-polymerization initiator | ① | 2-Methyl-1-[4-(methylthio)phenyl]-2-morphorinopropan-1-one |
| | ② | ADEKA OPTOMER SP-152 (manufactured by ASAHI DENKA Co., Ltd.) |
| Others | ① | Dicyandiamide |
| | ② | Tetraphenyl phosphonium bromide |
| | ③ | Ethanol |

A test substrate was prepared under the following conditions by drawing an image on a substrate by means of an ink jet printer using the photocurable and thermosetting composition mentioned above, then curing the resultant coating by UV irradiation, and further curing it by heating.

<Drawing Conditions with Ink Jet Printer>:
 Film thickness: 20 μm
 Apparatus: a piezo system ink jet printer was used (head temperature: 50° C.).

<UV Curing Conditions>:
 Exposure Dose: 1,000 mJ/cm$^2$

<Thermal Curing Conditions>:
 170° C×30 minutes

The test substrate prepared as described above was tested for the properties shown in Table 3 and the results were rated. The results are shown in Table 3.

TABLE 3

| Properties | Example No. 1 | 2 | 3 | 4 | 5 | 6 | 7 | Com. Exam. 1 |
|---|---|---|---|---|---|---|---|---|
| Viscosity (mPa·s) | 79.1 | 65.9 | 105.3 | 73.6 | 83.5 | 19.5 | 115.2 | 65.2 |
| Hardness | 3H | 3H | 3H | 2H | 3H | 2H | 3H | 3H |
| Solvent | ○ | ○ | ○ | ○ | ○ | ○ | ○ | ○ |

TABLE 2

| Composition (parts by weight) | | Example No. 1 | 2 | 3 | 4 | 5 | 6 | 7 | Com. Exam. 1 |
|---|---|---|---|---|---|---|---|---|---|
| Component A | ① | 10 | | | 10 | | | | |
| | ② | | | | | | 20 | | |
| | ③ | | 20 | | 40 | | | | |
| | ④ | 20 | | | | | 10 | | |
| | ⑤ | | | | | 30 | | | |
| | ⑥ | | 24 | | | 15 | | | |
| | ⑦ | | | 20 | | | | | |
| | ⑧ | | | 40 | | | | | |
| Component B | ① | | | | | | | 2 | |
| | ② | | 20 | | | 15 | 20 | | |
| | ③ | | | | 10 | | | | |
| | ④ | | | | 5 | 15 | 20 | | |
| | ⑤ | 50 | 10 | | | 25 | 30 | | 10 |
| | ⑥ | | | 20 | | | | | |
| | ⑦ | | | | 30 | | | | |
| | ⑧ | | | | 45 | | | | |
| | ⑨ | | | | 10 | 10 | | | |
| | ⑩ | | | | | 15 | | | |
| Photo-polymerization initiator | ① | 2.5 | 2.5 | 2.5 | 0.5 | 2.5 | 2.5 | 2.5 | 2.5 |
| | ② | | | | 2.5 | 2.5 | | | |
| Others | ① | | | | 0.2 | | | | |
| | ② | | 4 | | | | | | 4 |
| | ③ | 10 | | 10 | | | | | |

TABLE 3-continued

| | Example No. | | | | | | | Com. |
|---|---|---|---|---|---|---|---|---|
| Properties | 1 | 2 | 3 | 4 | 5 | 6 | 7 | Exam. 1 |
| Resistant Chemical Resistance | ○ | ○ | ○ | ○ | ○ | ○ | ○ | X |
| Resistance to Soldering Heat | ○ | ○ | ○ | ○ | ○ | ○ | ○ | X |
| Resistance to Electroless Gold Plating | ○ | ○ | ○ | ○ | ○ | ○ | ○ | X |

As shown in Table 3, although the photocurable and thermosetting compositions for the ink jet system prepared in Examples 1 to 7 in accordance with the present invention had so low viscosity that they can be injected by the ink jet system, they invariably allowed the formation of a pattern of a cured film excelling in resistance to chemicals, resistance to soldering heat, and resistance to electroless gold plating required of a solder resist. On the other hand, Comparative Example 1 which did not contain the component (A) of the present invention was inferior in these properties.

Incidentally, the methods for evaluating the properties shown in Table 3 are as follows:

<Viscosity>:

This property was determined in accordance with the method specified in JIS K 2283. Incidentally, the measurement temperature was 25° C.

<Coating Film Hardness>:

This hardness was determined in accordance with JIS K 5400.

<Solvent Resistance>:

After immersion in acetone for 30 minutes, the cured film was visually examined to evaluate the state of the film and rated on the following criterion.
  ○: Absolutely no discernible change was found.
  Δ: Presence of very slight change (whitening) was found.
  X: The film was swollen or separated from the substrate.

<Chemical Resistance>:

After immersion in an aqueous 5 wt. % sulfuric acid solution for 10 minutes, the cured film was visually examined to evaluate the state of the film and rated on the following criterion.
  ○: Absolutely no discernible change was found.
  Δ: Presence of very slight change (whitening) was found.
  X: The film was swollen or separated from the substrate.

<Resistance to Soldering Heat>:

In accordance with the method specified in JIS C-6481, after immersion in a soldering bath kept at 260° C. for 10 seconds, the cured film was subjected to a peeling test with an adhesive cellophane tape and visually examined to evaluate the state of the film and rated on the following criterion.
  ○: No discernible change was found in the film.
  Δ: Presence of change was found in the film.
  X: The film was separated from the substrate.

<Resistance to Electroless Gold Plating>:

The test substrate was plated successively in an electroless nickel plating bath and an electroless gold plating bath, both available in the market, under the conditions of 0.5 μm of nickel and 0.03 μm of gold. After the plating, the cured film was visually examined to evaluate the state of the film surface. The criterion for evaluation is as follows:
  ○: Absolutely no discernible change was found.
  Δ: Presence of very slight change was found.
  X: Conspicuous whitening or clouding appeared in the film.

As described above, although the photocurable and thermosetting composition of the present invention for the ink jet system has so low viscosity that it can be injected by the ink jet system, it allows the formation of a fine pattern excelling in various properties required of a solder resist, such as heat resistance, resistance to soldering heat, resistance to chemicals, hardness, electrical insulating properties, and resistance to electroless plating. Accordingly, it can be advantageously used in the formation of a solder resist pattern on a printed circuit board by the ink jet system. Further, since the photocurable and thermosetting composition of the present invention for the ink jet system exhibits resistance to heat, it is also useful as a marking ink or the like which requires the heat resistance.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and the range of equivalency of the claims are, therefore, intended to be embraced therein.

The International Application PCT/JP2004/006029, filed May 7, 2004, describes the invention described hereinabove and claimed in the claims appended hereinbelow, the disclosure of which is incorporated here by reference.

What is claimed is:

1. A photocurable and thermosetting composition having heat resistance for an ink jet system, comprising:
  (A) a monomer having a (meth) acryloyl group and a thermosetting functional group;
  (B) a photoreactive diluent having a weight-average molecular weight of not more than 700 other than said monomer (A); and
  (C) a photopolymerization initiator,
  wherein said composition has a viscosity of not more than 150 mPa·s at 25° C.

2. The composition according to claim 1, wherein the thermosetting functional group of said monomer (A) is at least one member selected from the group consisting of a hydroxyl group, a carboxyl group, an isocyanate group, an amino group, an imino group, an epoxy group, an oxetanyl group, a mercapto group, a methoxymethyl group, a methoxyethyl group, an ethoxymethyl group, an ethoxyethyl group, and an oxazoline group.

3. The composition according to claim 1, wherein said photoreactive diluent (B) is a monomer which has at least one photoreactive group selected from the group consisting of an unsaturated double bond, an oxetanyl group, and an epoxy group and is in the liquid state at room temperature.

4. The composition according to claim 1, wherein said photopolymerization initiator (C) is at least one member selected from the group consisting of photo-radical polymerization initiators and photo-cationic polymerization initiators.

5. A method of forming a solder resist pattern on a printed circuit board, comprising:
  providing said photocurable and thermosetting composition set forth in claim 1;

forming a resist pattern with said photocurable and thermosetting composition;
irradiating the resist pattern with an active energy ray to primarily cure the resist pattern; and
curing the resist pattern by heating.

6. The method according to claim 5, wherein said forming comprises drawing the resist pattern with said photocurable and thermosetting composition by an ink jet printer.

* * * * *